(12) United States Patent
Vaskivskyi et al.

(10) Patent No.: US 9,818,479 B2
(45) Date of Patent: Nov. 14, 2017

(54) SWITCHABLE MACROSCOPIC QUANTUM STATE DEVICES AND METHODS FOR THEIR OPERATION

(71) Applicant: Jozef Stefan Institute, Ljubljana (SI)

(72) Inventors: Igor Vaskivskyi, Kijev (UA); Dragan D. Mihailović, Ljubljana (SI); Ian A. Mihailović, Ljubljana (SI)

(73) Assignee: JOZEF STEFAN INSTITUTE, Ljubljana (SI)

( * ) Notice: Subject to any disclaimer, the term of this patent is extended or adjusted under 35 U.S.C. 154(b) by 0 days.

(21) Appl. No.: 14/802,553

(22) Filed: Jul. 17, 2015

(65) Prior Publication Data

US 2016/0019954 A1   Jan. 21, 2016

(30) Foreign Application Priority Data

Jul. 21, 2014 (GB) .................................. 1412884.7

(51) Int. Cl.
*G11C 13/00* (2006.01)
*H01L 45/00* (2006.01)
*H01L 27/24* (2006.01)

(52) U.S. Cl.
CPC ...... *G11C 13/0069* (2013.01); *G11C 13/0002* (2013.01); *G11C 13/0097* (2013.01); *H01L 45/005* (2013.01); *H01L 45/126* (2013.01); *H01L 45/1286* (2013.01); *H01L 45/142* (2013.01); *H01L 45/143* (2013.01);
(Continued)

(58) Field of Classification Search
CPC ............ G11C 11/5664; G11C 11/5685; G11C 13/0007; G11C 13/0014; G11C 13/0009; G11C 13/0097
See application file for complete search history.

(56) References Cited

U.S. PATENT DOCUMENTS 8,907,314 B2 * 12/2014 Barabash ................ H01L 45/08
257/2
2007/0145345 A1   6/2007 Ino
2011/0227031 A1   9/2011 Li
(Continued)

FOREIGN PATENT DOCUMENTS

CN     103427021       12/2013
EP       1343154        9/2003
WO  WO 2014/084799    6/2014

OTHER PUBLICATIONS

Sipos, et al. (2008) Nature Materials 7:960-965, "From Mott state to superconductivity in 1T-TaS2".
(Continued)

*Primary Examiner* — Andrew Q Tran
(74) *Attorney, Agent, or Firm* — Swanson & Bratschun, L.L.C.

(57) ABSTRACT

Discloses is an electronic device and a method for its operation. The device has first and second electrodes and an active material. The active material has selectable and stable first and second macroscopic quantum states, such as charge density wave ordered states, having respectively first and second values of electrical resistivity $\rho_1$ and $\rho_2$ at the same temperature. $\rho_1$ is at least 2 times $\rho_2$. The method includes the step of switching between the first and second macroscopic quantum states by injection of current via the electrodes.

9 Claims, 9 Drawing Sheets

(52) U.S. Cl.
CPC .. *G11C 13/0007* (2013.01); *G11C 2013/0078* (2013.01); *H01L 27/2463* (2013.01)

(56) References Cited

U.S. PATENT DOCUMENTS

| | | | |
|---|---|---|---|
| 2011/0266513 A1 | 11/2011 | Williams | |
| 2011/0309321 A1 | 12/2011 | Yang | |
| 2012/0026776 A1 | 2/2012 | Yang | |
| 2012/0113706 A1 | 5/2012 | Williams | |
| 2013/0336037 A1* | 12/2013 | Chen | H01L 27/249 365/51 |
| 2014/0183432 A1 | 7/2014 | Barabash | |

OTHER PUBLICATIONS

Wilson, et al. (1975) Advanced Physics 24:117-201, "Change-Density Waves and Superlattices in Metallic Layered Transition-Metal Dichalcogenides".
Rossnagel (2011) J Phys-Condens Mat 23:213001, "On the origin of charge-density waves in select layered transitionmetal dichalcogenides".
Latyshev, et al. (1997) Phys Rev Lett 78:919, "Effect on Charge Density Wave".
Zybtsev, et al. (2010) Nat Comms 1:85, "'Quantized' states of the charge-density wave in microcrystals of k0. 3MoO3".
McMillan (1976) Phys Rev B 14:1496-1502, "Theory of discommensurations and the commensurate/incommensurate charge-density-wave phase transition".
Tosatti & Fazekas (1976) J. Phys. Colloques 37:C4-165-C4-168, "On the Nature of the Low-Temperature Phase of 1T-TaS2".
Fazekas & Tosatti (1980) Physica B & C 99:183-187, "Charge Carrier Localization in Pure and Doped 1T-TaS2".
Fazekas & Tosatti (1979) Phil. Mag. Part B 39:229-244, "Electrical, structural and magnetic properties of pure and doped 1T-TaS2".
Stojchevska, et al. (2014) Science 344:177, "Ultrafast Switching to a Stable Hidden Quantum State in an Electronic Crystal" and Supplementary Information.
Uchida, et al. (1978) Solid State Communications 27:637-640, "Nonlinear conduction in two-dimensional CDW system: 1T-TaS2".
Zettl & Gruner (1982) Phys. Rev. B 5:700, "Onset of charge-density-wave conduction: Switching and hysteresis in NbSe3".
Monceau (2012) Adv Phys 61:325-581, "Electronic crystals: an experimental overview".
Sawa (2008) Materials Today 11:38-36, "Resistive switching in transition metal oxides".
Waser & Aono (2007) Nature Materials, "Nanoionics-based resistive switching memories".
Vaju, et al. (2008) Advanced Materials 20:2760-2765, "Electric-Pulse-driven Electronic Phase Separation, Insulator-Metal Transition, and possible Superconductivity in a Mott Insulator".
Cario et al. (2010) Adv Mater 22:5193-5197, "Electric-Field-induced resistive switching in a family of mott insulators: Towards a new class of RRAM memories".
Welnic (2005) Nature Materials 5:56-62, "Unravelling the interplay of local structure and physical properties in phase-change materials".
Wong, et al. (2010) Proceedings of the IEEE 98:2201-2227, "Phase Change Memory".
Spijkerman, et al. (1997) Phys Rev B, "X-ray crystal-structure refinement of the nearly commensurate phase of 1T-TaS_{2} in (3+2)-dimensional superspace".
Yamamoto (1983) Phys. Rev. B 27:7823-7826, "Hexagonal domainlike structure in 1 T-TaS_{2}".
Nakanishi & Shiba (1984) J. Phys. Soc. Japan 53:1103-1113, "Theory of Three-Dimensional Orderings of Charge-Density Waves in 1T-TaX2 (X:S, Se)".
Ishiguro & Sato (1991) Phys Rev B 44:2046, "Electron microscopy of phase transformations in 1T-TaS_{2}".
Requardt, et al. (1998) Phys Rev Lett 80:5631-5634, "Direct Observation of Change Density Wave Current Conversions by Spatially Resolved Synchrontron X-Ray Studies in NbSe {sub 3}".
Nakanishi, et al. (1977) J. Phys. Soc. Japan 43:1509-1517, "The Nearly Commensurate Phare and Effect of Harmonics in Successive Phase Transition in 1T-TaS_{2}".

\* cited by examiner

SWITCHABLE MACROSCOPIC QUANTUM STATE DEVICES AND METHODS FOR THEIR OPERATION

RELATED APPLICATIONS

This application claims priority to Great Britain Application No. 1412884.7, filed Jul. 21, 2014, entitled "Switchable Macroscopic Quantum State Devices and Methods for Their Operation," the content of which is hereby incorporated by reference in its entirety and for all purposes.

BACKGROUND TO THE INVENTION

Field of the Invention

The present invention relates to switchable macroscopic quantum state devices and to methods of operation and uses of such devices. Such devices have particular, but not necessarily exclusive, application in the area of information storage, such as memory cells.

Related Art

The size scaling of Si-based integrated-circuit components (CPU and memory), has followed the well-known Moore's law for the last few decades. However, this doubling of capacity every two years, due to a reduction in feature size, is predicted to come to an end for the case of non-volatile (flash) memory: the thickness of the oxide insulator layer in such field-effect transistor devices will be insufficient to prevent electrons trapped at the gate from tunnelling away, thereby causing volatility. There is a need, therefore, for a new scalable, non-volatile memory technology to replace flash.

Phase-change (PC) materials are of interest for non-volatile electronic-memory technology to replace flash memory. Suitable phase change materials have amorphous and crystalline states with different values of electrical resistivity, thereby enabling the encoding of bits of information. Furthermore, suitable phase change materials may allow fast, reversible transformations between the amorphous and crystalline states by suitable control of the temperature and heating/cooling rate of the material. Typically, heat is applied to the material to control the temperature by passing electrical current through the material and relying on Joule heating. Thus, the ability of phase-change (PC) materials to be reversibly and rapidly transformed between high-resistance amorphous and low-resistance crystalline states by joule heating via imposed current pulses provides the potential for recording binary bits of information.

Most PC memory materials investigated to date have been Ge—Sb—Te (GST) compounds, of which $Ge_2Sb_2Te_5$ (GST 225) is probably the most studied. A useful review of PC memory technologies is set out in Wong et al (2010).

PC memory is one example of resistance-based memory. Other examples exploit different mechanisms for developing different electrical resistance in the memory cell.

In US 2011/0227031, a two-terminal memristor device is disclosed with an active region containing a primary material for controlling the flow of charge between the terminals and a secondary material. The composition of the primary material is $ABO_3$, where A is a divalent element and B is Ti, Zr or Hf. The secondary material is provided in order to store oxygen ions generated during the formation of the active region, in order to prolong the useful life of the device. US 2011/0266513 discloses a memristor device which similarly has an active region with primary and secondary sub-regions, control of the resistance of the active region being by control of dopants in the primary sub-region from the secondary sub-region.

US 2011/0309321 discloses a memristor with a switching layer held between first and second electrodes. The switching layer is a composite of an insulating phase and a conductive phase, which can be treated to provide a conductive channel between the electrodes.

US 2012/0026776 discloses a memristor in which the active layer is subject to oxygen ion reconfiguration under the influence of an applied electric field to provide control of the electrical resistance of the active layer.

US 2012/0113706 discloses a memristor based on a mixed metal valence phase in contact with a fully oxidized phase. The mixed metal valence phase in effect is a condensed phase of dopants for the oxidized phase, the dopants drifting into and out of the oxidized phase in response to an electric field, thereby affecting the resistance of the device.

SUMMARY OF THE INVENTION

The present inventors have studied materials systems which provide different mechanisms for control of electrical resistance, compared with the amorphous-crystalline phase change materials and compared with the memristor materials discussed above.

The present invention stems from work done on optical switching between macroscopic quantum states. This work was reported in Stojchevska et al (2014), in which $1T\text{-}TaS_2$ (a polytype of tantalum disulphide, a layered quasi-two-dimensional chalcogenide) was subjected to a 35-femtosecond laser pulse at 800 nm at 1.5K. The quench provided by the laser pulse was found to result in a reduction of electrical resistance of up to three orders of magnitude. In that work, it was speculated that a hidden, spontaneously ordered macroscopic quantum state had been reached as a result of the laser pulse and quench.

The present inventors have recognised that the work reported in Stojchevska et al (2014) may provide the basis for fast switching between different resistance states in electronic devices. However, the laser pulse induced switching reported on Stojchevska et al (2014) is relatively unwieldy and unsuited to integration with existing device architecture. It would be very much more convenient to provide a device which is operable without the need for optical switching, but there is no reason to believe that a mechanism such as that reported in Stojchevska et al (2014) could operate without optical switching.

The present invention has been devised in order to address at least one of the above problems. Preferably, the present invention reduces, ameliorates, avoids or overcomes at least one of the above problems.

The present invention is based on the inventors' findings that switching between macroscopic quantum states providing substantial differences in electrical resistivity is surprisingly possible using current injection. This allows a device to be constructed in which switching is controlled simply by current injection from electrical contacts. Accordingly, this constitutes a general aspect of the invention.

In a first preferred aspect, the present invention provides a method for operating an electronic device, the device having first and second electrodes and an active material, the active material having selectable and stable first and second macroscopic quantum states having respectively first and second values of electrical resistivity $\rho_1$ and $\rho_2$ at the same temperature, wherein $\rho_1$ is at least 2 times $\rho_2$, the method including the step of switching between the first and second macroscopic quantum states by injection of current via the electrodes.

In a second preferred aspect, the present invention provides an electronic device having first and second electrodes and an active material, the active material having selectable and stable first and second macroscopic quantum states having respectively first and second values of electrical resistivity $\rho_1$ and $\rho_2$ at the same temperature, wherein $\rho_1$ is at least 2 times $\rho_2$, the device being capable of being switched between the first and second macroscopic quantum states by injection of current via the electrodes.

In a third preferred aspect, the present invention provides use of the electronic device according to the second aspect as an information storage device, the use including a writing (W) step of current injection via the electrodes to switch the active material between the first and second macroscopic quantum states, an optional reading (R) step of determining the macroscopic quantum state of the active material based on the electrical resistance of the active material and an optional erasing (E) step to return the active material to the second or first macroscopic quantum state.

The first, second and/or third aspect of the invention may be combined with each other in any combination. Furthermore, the first, second and/or third aspect of the invention may have any one or, to the extent that they are compatible, any combination of the following optional features.

The device may be a memory element, the different macroscopic quantum states of the active material representing different memory states for the memory element. As will be well understood, the first and second macroscopic quantum states can be assigned binary values 0 and 1, or 1 and 0, respectively, in order to store one bit of information.

The device may be incorporated in a memory cell. The memory cell may include resistance determining means for determining the resistance of the active material. The memory cell may further include heating means for heating the active material. Heating may be used in the erase step.

The present invention may provide a data storage module including an array of memory cells as set out above, the data storage module being a further aspect of the present invention.

Preferably, the switching between the macroscopic quantum states is reversible and/or repeatable. In use, the active material may be intended for cycling between the first and second macroscopic quantum states at least 10 times. More preferably, the active material may be intended for cycling between the first and second macroscopic quantum states at least $10^3$ times, more preferably at least $10^5$ times, at least $10^7$ times, at least $10^9$ times, at least $10^{11}$ times or at least $10^{13}$ times.

Preferably, the macroscopic quantum states have different charge density wave order. The different charge density wave order for each macroscopic quantum state provides the different resistivity $\rho_1$ and $\rho_2$ at the same temperature. The present invention therefore provides a resistivity change not via lattice melting and cooling, as in phase change materials, where the cooling rate determines whether the material becomes amorphous (with one resistivity value) or crystalline (with another resistivity value). The switching between different macroscopic quantum states may therefore be achieved in the present invention preferably without substantial heating of the active material. It is preferred that the write (W) step is achieved without heating of the active material. The erase (E) step may be performed by heating of the active material, and optional subsequent cooling. In this case, heating may be carried out by a separate heater. Alternatively, for simplicity, heating may be carried out via Joule heating of the active material by current passing between the electrical contacts.

It is possible for the active material to have a third selectable and stable macroscopic quantum state having value of electrical resistivity $\rho_3$, different from $\rho_1$ and $\rho_2$ at the same temperature. In this case the active material is preferably also capable of being switched to the third macroscopic quantum state by injection of current via the electrodes. Fourth or higher selectable and stable macroscopic quantum states may also be possible. This can allow the device, when used in a memory cell, to store more than one bit of information.

In a preferred embodiment, the present invention therefore provides an electrically switchable resistive device based on switching between charge-ordered states in the active material, the active material comprising a layered dichalcogenide.

Preferably, after the write (W) step is carried out, the current injection is stopped and the active layer remains in the switched macroscopic quantum state. Therefore the current injection typically takes place as a current pulse. The current pulse for the write step may have a duration $\tau_W$ of less than 1 µs, more preferably less than 100 ns, more preferably less than 50 ns, more preferably less than 20 ns. Optical switching has been shown to be achieved using a 35 fs laser pulse. The inventors speculate that the switching process may take longer than this, but still substantially less than the 20 ns time scale mentioned above. Since it is speculated that the switching process may take about 1 ps, it is preferred that the duration of the current pulse may be less than 1 ns, more preferably less than 0.1 ns, still more preferably less than 0.01 ns.

Preferably, the erase (E) step is carried out by increasing the temperature of the active material to affect the macroscopic quantum state of the active material. Following the increase of temperature, the active material may be cooled to a preferred operating temperature, ready for a subsequent read (R) or write (W) step. The erase step may be carried out by Joule heating with a current passing through the active material. However, in this case the time taken to provide a suitable temperature rise may be relatively high. Therefore in more complex embodiments, a heater may be provided, separately from the active material and its electrical contacts, to change the temperature of the active material for the erase step. In this case, the duration of the erase step may be less than 1 µs, more preferably less than 100 ns, more preferably less than 50 ns, more preferably less than 20 ns.

$\rho_1$ can be expressed as X times $\rho_2$. Preferably, X is at least 5, at least 10, at least 100 or more preferably at least 1000. As will be understood, provided that the difference between $\rho_1$ can be determined reliably, then the memory cell is able to store information based on that difference.

$\rho_3$ can be expressed as Y times $\rho_2$. Preferably, Y is less than X, meaning that $\rho_3$ is greater than $\rho_2$ but less than $\rho_1$. Preferably, Y is at least 5, at least 10, at least 100 or more preferably at least 500.

In the read (R) step, preferably the resistance of the active material is determined. This can be done by measuring the resistance between the current injection contacts. This may be suitable for simple device architecture where X is relatively high. However, in other embodiments, the resistance of the active material is determined by other means, e.g. by dedicated resistance measurement contacts. In this way, the resistance can be determined by a four point measurement method, which is typically more accurate than a two point measurement method.

Alternatively, the change in macroscopic quantum state of the active material may result in other changes than resistivity. For example, an optical property of the active material may change, such as dielectric constant. In that case, the read step may be carried out optically. In such embodiments, the active material may be available for optical interrogation. For example, a transparent electrode may be used to allow interrogation light to illuminate the active material. After interaction with the active material, the interrogation light may be analysed to determine the macroscopic quantum state of the active material.

In the data storage module, the array of memory cells may be provided in a cross bar configuration, with common current injection electrodes.

Preferably, the active material is formed from a chalcogenide material. More preferably, the active material is formed from a layered dichalcogenide material. Suitable materials include 1T-$TaS_2$ and 1T-$TaS_xSe_{2-x}$. It is at present considered that any material which supports multiple charge ordered states may be used in the present invention, including rare earth tri-tellurides. For example, it is considered at present that many materials support suitable macroscopic quantum states (such as charge density wave (CDW) ordering). Suitable materials include: $MX_3$ compounds such as $NbSe_3$, $TaS_3$, $NbS_3$, $ZrTe_3$, etc.); transition metal tetrachalcogenides $(MX_4)_n$ Y (such as $(TaSe_4)_2I$, $(NbSe_4)_3I$, $(NbSe_4)_{10}I_3$); blue and purple bronzes ($K_{0.3}MoO_3$, $Rb_{0.3}MoO_3$, $Tl_{0.3}MoO_3$); molybdenum sub-oxides $Mo_xO_y$, such as $Mo_4O_{11}$; O organic CDW systems such as Bechgaard-Fabre salts and TCNQ salts.

Preferably, the active material is formed as a layer over a substrate. The thickness of the active material is preferably less than 100 μm, e.g. less than 10 μm, more preferably less than 1 μm and still more preferably 500 nm or less. The active material may have a thickness of 1 nm or more, more preferably 5 nm or more, more preferably 10 nm or more.

The temperature of the active material during the write step is preferably as close to ambient temperature as the material will allow, for operational convenience. However, for some materials, suitable macroscopic quantum states are only available at relatively low temperatures. The temperature of the active material during the write step may therefore be 100K or lower, more typically for present materials 40K or lower. Temperatures of 20K or lower may be advantageous for some embodiments. Operation at higher temperatures may still be possible, taking account of the performance of the active material at such temperatures. In particular, it is found that at higher temperatures, the macroscopic quantum states may be metastable, that is they may have a predictable relaxation time before reverting to a more thermodynamically stable state. In that case, the desired macroscopic quantum state may be periodically refreshed, e.g. by a further current injection, to maintain the macroscopic quantum state. In memory applications, for example, this may be acceptable where embodiments of the invention provide very high density memory compared with known devices. In this way, embodiments of the present invention may operate such that the temperature of the active material during the write step is up to 250K. Operation at up to 300K (i.e. ambient temperature) is particularly preferred. In these cases, the device is preferably operated with a periodic refresh step, to maintain the desired macroscopic quantum state.

Preferably, the current injection is achieved at relatively low voltage. The preferred arrangement is for the current injection for at least the write step to be achieved at transistor logic levels. For example, preferably the current injection is achieved at voltage of 20V or less, more preferably 12V or less, more preferably 10V or less, more preferably 8V or less, more preferably 6V or less, more preferably about 4V. In terms of electric field strength, preferably the current injection is achieved at electric field strength of 50 kV/cm or less, more preferably 30 kV/cm or less, more preferably 25 kV/cm or less, more preferably 12 kV/cm or less, more preferably 15 kV/cm or less, more preferably about 10 kV/cm.

Further optional features of the invention are set out below.

BRIEF DESCRIPTION OF THE DRAWINGS

Embodiments of the invention will now be described by way of example with reference to the accompanying drawings in which:

FIGS. 2a-2f collectively show the resistance switching behavior of a 1T-$TaS_2$ sample resulting from the application of short electrical pulses. In particular:

FIGS. 3a-3e collectively demonstrate the resistance of the C and the F (final, or switched) states after repeated cycling, In particular:

DETAILED DESCRIPTION OF THE PREFERRED EMBODIMENTS, AND FURTHER OPTIONAL FEATURES OF THE INVENTION

The preferred embodiments of the present invention are based on the realisation that competing interactions in charge ordered systems may support a variety of ground states at different temperatures or pressures, leading to relatively complex phase diagrams. The layered dichalcogenide $1T-TaS_2$ is a particularly interesting system in which competition between Coulomb interactions, lattice strain and a Fermi surface instability lead to different charge ordered states[1-3]. [Sipos et al (2008), Wilson et al (1975), Rossnagel (2011)—see list of full references below]. In this disclosure, we show that non-thermal switching between co-existing macroscopic quantum states with different charge density wave order can be achieved using short electrical pulses in $1T-TaS_2$ and similar materials. Very fast switching of resistance and bi-stable operation provides a new approach to the use of macroscopic quantum states in electronics.

An important feature of charge-density wave (CDW) ordered systems is that the system can be described as a macroscopic quantum state. The quantum nature of CDW states was recently demonstrated in quantum interference experiments [Latyshev et al (1997)] and quantized conductance jumps [Zybtsev et al (2010)]. In systems with competing interactions multiple minima may exist in the free energy landscape. If the energy barriers between these minima are sufficiently large, different CDW states can stably coexist, and it is possible to achieve controllable switching between different charge-ordered states by external stimuli.

The most usual charge-ordered state in $1T-TaS_2$ is the nearly-commensurate (NC) state at temperatures between about 180 K and about 350 K. It is thought to arise from the competition of a Fermi surface instability, a lattice polaronic effect and long-range Coulomb interactions [Sipos et al (2008), McMillan (1976)]. The NC phase can be described as an ordered texture of hexagonal polaron clusters, each polaron within the cluster being composed of a single electron (e) localized on a Ta atom, and 12 slightly displaced surrounding Ta atoms in the form of a star. On cooling below 180K the NC state undergoes a transition to a commensurate (C) polaronic lattice, which is a Mott insulator at low temperatures. [Tosatti et al (1976), Fazekas and Tosatti (1980) and Fazekas and Tosatti (1979)].

Recently the inventors' research group has shown that a single near-infrared 35 femtosecond laser pulse can cause switching between charge-ordered states, which is manifested by an abrupt change of the resistivity of nearly 3 orders of magnitude [Stojchevska et al (2014)]. The switching was attributed to non-thermal transitions from the insulating C state to a hidden (H) metallic state in which the system can coexist with the C state at low temperatures below about 60K.

The preferred embodiments of the present invention provides controllable non-thermal switching between different ordered states in the $1T-TaS_2$ achieved with electrical pulses injected through contacts, where the initial (C) state is part of the thermodynamic phase diagram, but the final (H) state is a well-defined state which is different than the optically reached state reported in Stojchevska et al (2014), yet is also not observed under thermodynamic equilibrium, i.e. it is not reachable under near-ergodic experimental conditions.

Single crystal samples of $1T-TaS_2$ between 20 and 120 nm thick, grown by the transport technique, were deposited on sapphire substrates by exfoliating as-grown material with sticky tape and re-depositing the exfoliated flakes directly onto the substrate. The crystal c axis of the samples was perpendicular to the plane of the substrate. Typical lateral dimensions were 100 μm, allowing four gold contacts to be deposited on the samples using laser direct photolithography with a LPKF Protolaser LDI laser writer. The contacts were made with a 5 nm Au/Pd intermediate layer before sputtering of 100 nm thick gold electrodes. The resistivity is measured either in 2 or 4 contact configuration, with low currents <1 μA to minimize perturbation of the H state by the measuring current.

Figure 1:
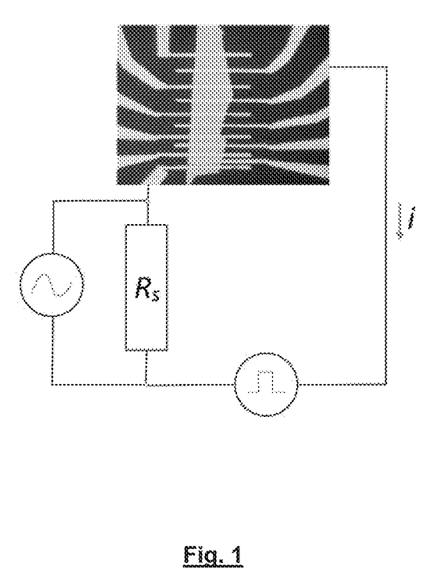
FIG. 1 shows a schematic measuring circuit and an optical micrograph of a typical 1T-$TaS_2$ sample and deposited contacts used for measurements.

The switching was performed with electrical pulses using either a Keithley measurement system (Keithley 6221 Current source and Keithley 2182A Nanovoltmeter) for pulses of duration $\tau_W$ greater than 5 μs. For intermediate pulse durations 20 ns<$\tau_W$<5000 ns a Stanford DG535 pulse generator was used, and an TI THS4211EVM amplifier. For pulses $\tau_W$<20 ns, a Hamamatsu PIN photodiode was used as a pulse generator giving RC time-constant limited electrical pulses $\tau_W$ of about 5 ns long upon exposure to 35 fs laser pulses. The experiments were performed in a Lake Shore 4-probe measuring station, a He-flow cryostat or a closed cycle Oxford instruments cryostat with semi-rigid RF cable connections made directly to the sample (for the ultrafast switching experiments). The measuring circuit and a typical sample used for measurements is shown in FIG. 1.

Temperature Dependence

Figure 2A:
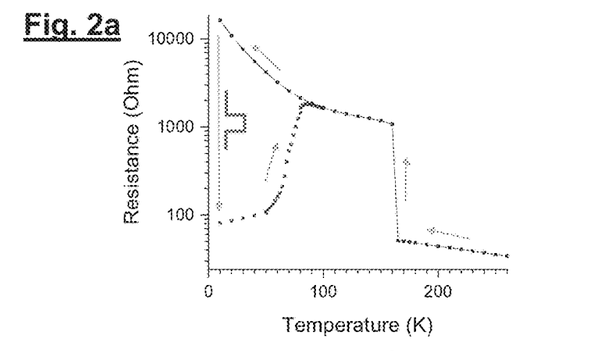
FIG. 2a shows resistance on cooling from room temperature to 4K (upper curve), and on heating to 100 K (lower curve), after an electrical W pulse (10 V, 1 μs) applied at 4 K. The left hand arrow indicates the change of resistance after a W pulse is applied.

FIG. 2a shows the effect of a short electrical pulse on the electrical resistivity in the C state of of $1T-TaS_2$. First the sample is cooled to 4 K, following the usual resistivity curve with an upturn at low T characteristic of the Mott state [Wilson et al (1975)]. A single electrical pulse 50 μs long at 10 V is then applied across two outer contacts at 4 K. The resistance measured between the inner contacts drops by nearly three orders of magnitude and remains nearly constant until $T_H$ at about 50 K, whereafter it starts to increase, gradually merging with the cooling curve.

Figure 2B:
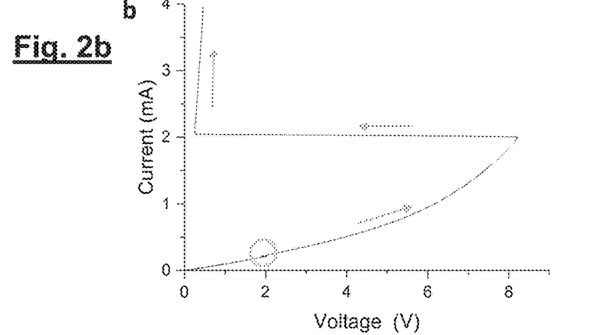
FIG. 2b shows an I-V curve measured at 40 K in pulsed mode ($\tau_W$=50 μs), where the current is incrementally increasing, and the voltage across the sample. The features of the curve are set out in more detail in FIGS. 2c-f.

To investigate the observed switching behavior, the switching experiment was repeated at 40K, but this time gradually ramping up the current each time a 50 μs pulse was applied, while simultaneously measuring the voltage across the inner contacts. In FIG. 2b the current increases nonlinearly with V. The most dramatic effect is observed at 8V at 2 mA (for this device), where the voltage drops rapidly, and the I-V characteristic becomes linear (ohmic) thereafter, extrapolating to the origin.

Figure 2C:
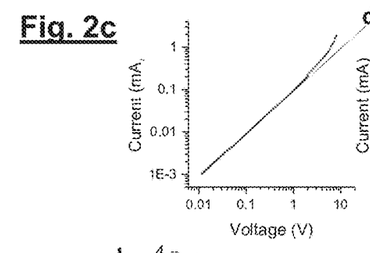
FIG. 2c shows that the I-V characteristic is linear up to 2 V.
Figure 2D:
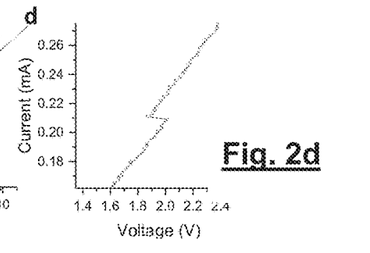
FIG. 2d shows a sharp discontinuity is observed at about 2 V, whereafter the current increases exponentially with voltage as shown in the log-linear plot FIG. 2e.
Figure 2E:
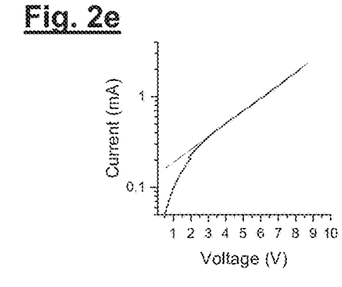
Figure 2F:
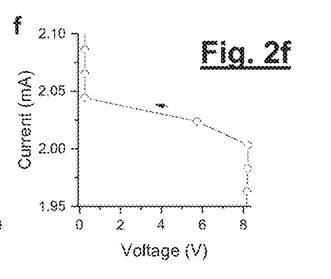
FIG. 2f shows that the switching occurs in a narrow current interval, at 8.1V for this sample.
Figure 3A:
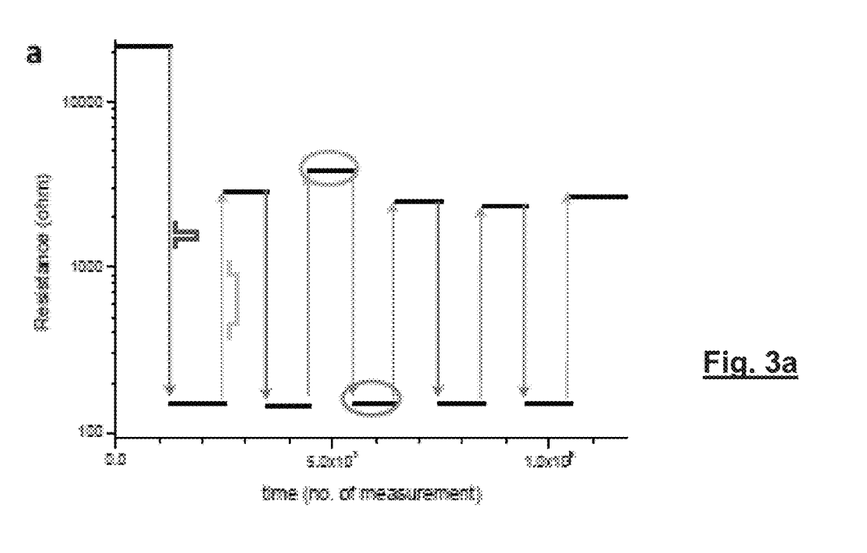
FIG. 3a shows that the final state reached after the W (write) pulses (V=20 V, $\tau_W$=5 s, T=26 K) appears to always have the same resistance (to within accuracy of the measurement), while the resistance after the E (erase) pulse (V=7 V, $\tau_E$=10 s) varies somewhat (note the logarithmic scale).
Figure 3B:
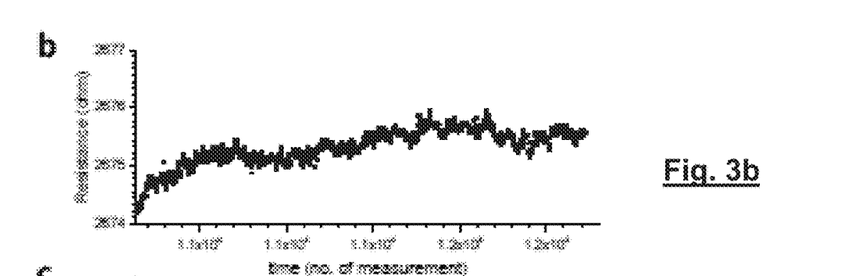
FIG. 3b shows the relaxation of the resistance in the E state (i.e. the state of the device after an erase pulse).
Figure 3C:
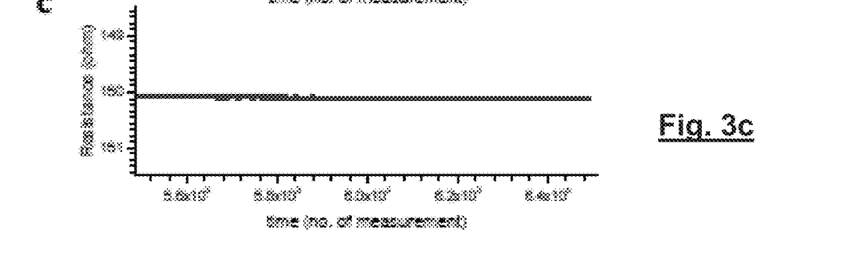
FIG. 3c shows the relaxation of the resistance in the H state (on the same scale as FIG. 3b) for a typical cycle (blue and red circles in FIG. 3a).

The I-V curve has some additional peculiar features. Up to about 2 V (10 kV/cm), the I-V response is linear, as shown by the log-log plot (FIG. 2c). At about 2 V, there is a small, but sharp discontinuity, and a voltage drop of about 0.1 V, while the current remains externally fixed by the source (FIG. 2d). Thereafter the current increases exponentially with voltage up to the threshold voltage of 8V, which is shown in the log-linear plot (FIG. 2e). Finally, note the remarkably sharp switching behaviour at 8 V shown on the expanded scale (FIG. 2f): switching occurs within a current interval ΔI<40 μA. The application of a longer electrical pulse, with the intention of raising the temperature of the device by Joule heating again leads to remarkably sharp switching of the resistance back to a high resistivity state without the need to heat the entire sample or the cryostat cold finger. However, in the first cycle, the resistance value reached after such an erase (E) process is lower than the original resistance value, possibly as a result of some priming effect at the contacts and/or temperature inhomogeneity during the application of the heating pulse. Subsequent cycling shows that the resistance of the erased state stabilizes after a few cycles, but still varies by about 10%, around a value which is about 30% below the original one (FIG. 3a). It also fluctuates in time by about 1 Ohm when measured over longer periods (FIG. 3b). In remarkable contrast, the low resistance state reached after the W pulse has a narrow spread of values (<2%), and once it is reached remains stable to <0.05 Ohms provided the device temperature is below about 40 K (FIG. 3c).

Stability of the H State

Figure 3D:
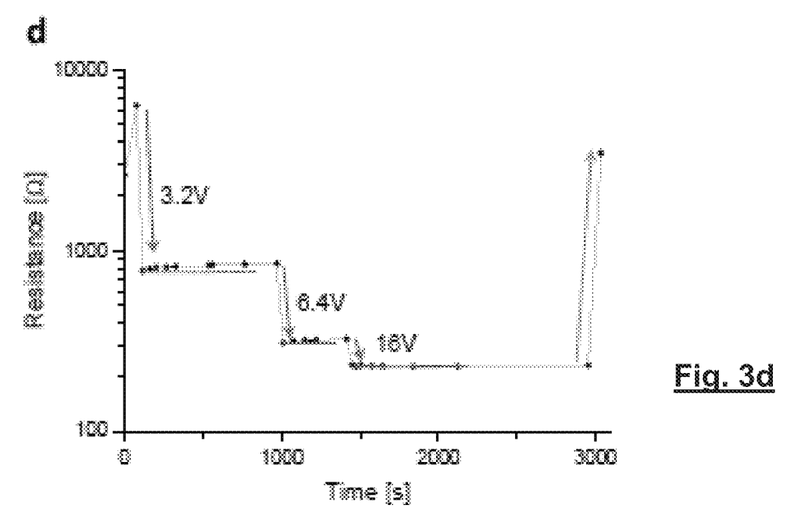
FIG. 3d shows a resistance cascade through intermediate states obtained by gradually increasing the switching voltage near threshold ($\tau_W$=2 μs) for a device with a 3 μm gap between contacts at T=4 K (note the logarithmic scale). This shows that multi-bit operation is possible.

The stability of the H state after switching depends on the temperature. Below 20 K it extends well beyond laboratory timescales (days). Above 40 K very slow relaxation is observed occurring on a timescale of hours. To investigate the relaxation behaviour near threshold, a series of W (write) pulses of increasing magnitude were applied, measuring the resistance relaxation after each W pulse (see FIG. 3d). The threshold for switching in this device is 3.2 V. After the 3.2 and 6.4 V pulses, the resistance first increases slightly, and then saturates after about 1000 s. Remarkably, for V=16 V, there is no such relaxation, and the resistance is constant after the W pulse.

Dependence of VT on Inter-Contact Distance

Figure 3E:
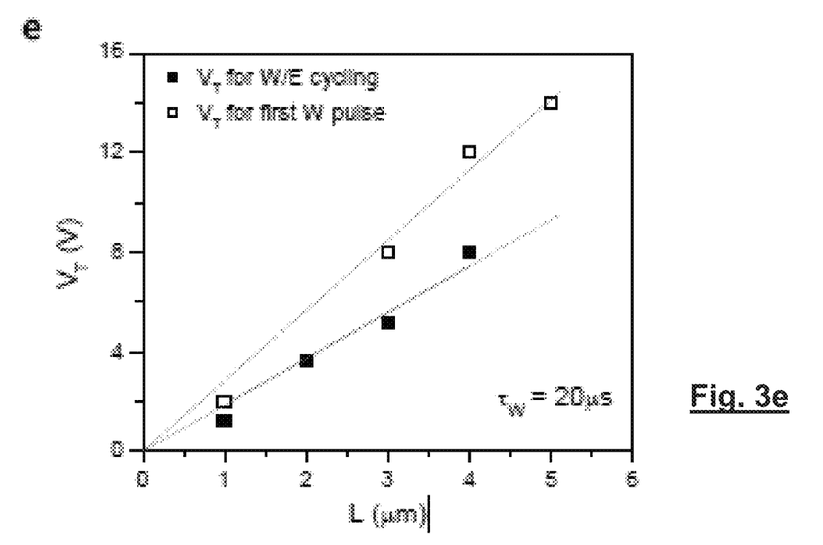
FIG. 3e shows the dependence of $V_T$ on distance between contacts L. VT is slightly higher in the first cycle than in subsequent cycles (see also FIG. 3a).

Measuring the threshold voltage $V_T$ as a function of distance between contacts, it is found that $V_T$ is always higher for the first W pulse, and settles thereafter, to a value which is about 20% lower. Both thresholds depend linearly on the inter-contact distance as shown in FIG. 3e. The threshold electric field obtained from these data is $E_T$ in the range of about $1.7 \times 10^4$ V/cm to about $2.5 \times 10^4$ V/cm. This is much higher than the (unusually low) 10 V/cm nonlinearity threshold previously reported for the CDW in the C state [Uchida et al (1978)], and is more in line with other related materials, such as $NbSe_3$ [Zettl and Gruner (1982)].

Pulse Length Dependence

Figure 4:
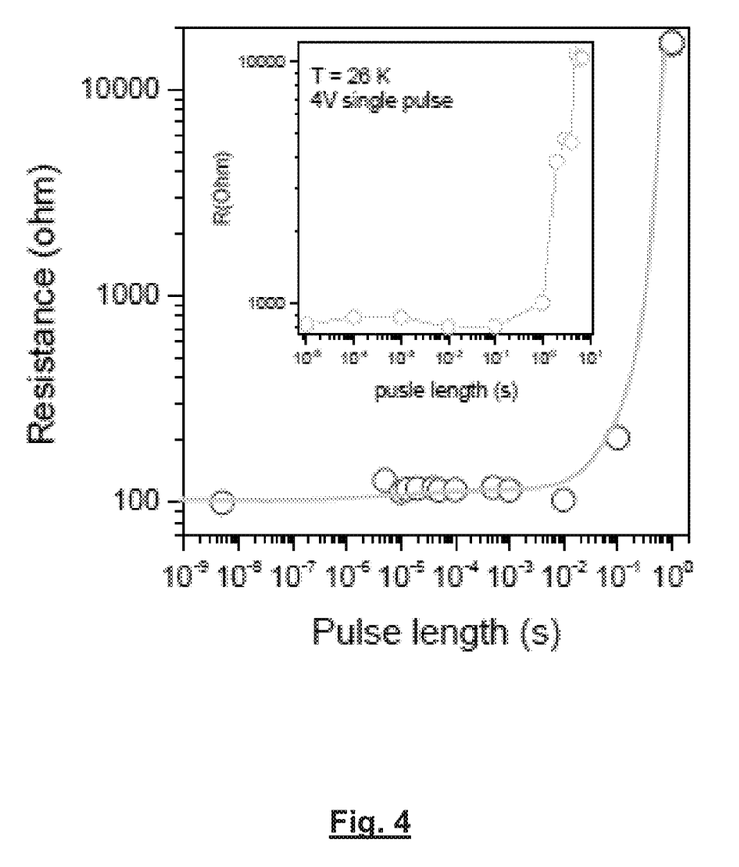
FIG. 4 shows the dependence of the switching threshold on pulse length τW. The insert shows a demonstration of switching with transistor logic level pulses (4V) to an intermediate state.

FIG. 4 shows the resistance of the device on varying the W pulse duration $t_P$. In each case a single pulse is applied. Switching is observed for all pulses with $t_P<1$ s. The switching speed of the device is limited by the pulse duration, which is presently limited by the capacitance of the device and the cryostat leads to about 5 ns. An abrupt erase threshold from the H to the C state is observed for tP>1 s, where switching is no longer observed, presumably because of Joule heating. The abrupt threshold strongly suggests that a critical temperature needs to be reached for the system to revert to the C state, such as $T_H$.

Speculation on the Mechanism for the W Process

The observed switching behavior is highly unusual for CDW systems. Switching behavior reported so far in quasi-onedimensional systems such as $K_{0.3}MoO_3$ and $NbSe_3$ is observed while the external field is on the sample, and relaxes back after the electric field is removed. The effect is usually ascribed to pinning [Monceau (2012)].

Resistance switching by electrical pulses has so far been observed in a variety of transition metal oxides [Sawa (2008)], in which the mechanisms for resistivity switching is related to ionic motion and/or charge transfer [Waser and Aono (2007)]. An applied voltage pulse induces excess mobile oxygen ions to form filamentary conducting paths in the active region. A similar mechanism appears operative in insulator to metal transitions induced by an electronic avalanche and dielectric breakdown in the narrow gap Mott Insulators such as $GaTa_4Se_8$ [Vaju et al (2008) and Cario et al (2010)]. In chalcogenide glasses such as $Ge_2Sb_2Te_5$ (GST) used in phase change memory devices, electrical pulses cause the material to melt. As it cools it reverts either to a high-resistance amorphous, or low-resistance structurally crystalline phase, depending on whether the cooling is fast or slow respectively[18,19]. [Welnic (2005) and Wong et al (2010)].

Ultrafast optical switching to the H state previously reported was suggested to be caused by a transient electron-hole charge imbalance arising from asymmetry at the states around the Fermi level which permits the formation of a new collectively ordered charge-ordered state after the photo excited carriers are relaxed. However, achieving such a charge imbalance optically is relatively difficult because the absorption of a photon creates equal numbers of electrons and holes, and photodoping can be achieved only on short timescales [Stojchevska et al (2014)]. The work disclosed here shows that a better way to create an electron-hole imbalance is by current injection via contacts. Thus using current injection one can control switching between quantum states and possibly even switching between thermodynamic states which exist in different regions of the phase diagram may be achieved (such as the C and NC states).

Considering the multitude of states on the energy landscape of $1T-TaS_2$, one may indeed expect metastable states. X-ray structure [Spijkerman et al (1997)] shows the NC state to be the best description of the domain structure, but very slightly different structures may exist [Yamamoto (1983)]. Nakanishi and Shiba (1984) note that the existence of the I-NC phase transition is 'somewhat accidental' since only a small change in the free energy parameters suppress it, as is the case in $TaSe_2$.

Apart from ordering within individual layers, there are other degrees of freedom leading to nearby states on the energy landscape, for example the T phase reached on heating is suggested to be stabilised by c-axis ordering. Layers may be stacked with distortions in phase, or in variety of stacking configurations, which are quite close in energy [Ishiguro and Sato (1991)].

Dynamic current conversion resulting from sliding currents in one-dimensional CDW systems has been studied in $NbS_3$, showing exponential spatial dependence of the q vector around the contacts under semi-static conditions [Requardt et al (1998)]. The spatial dependence of the q vector is related to the charge injection at the contacts, with asymmetric q arising from the different sign of the electron and hole injection at the two ends. They also reported a metastable q between 100 us pulses, 10 ms apart, which was attributed to pinning.

Figure 5:
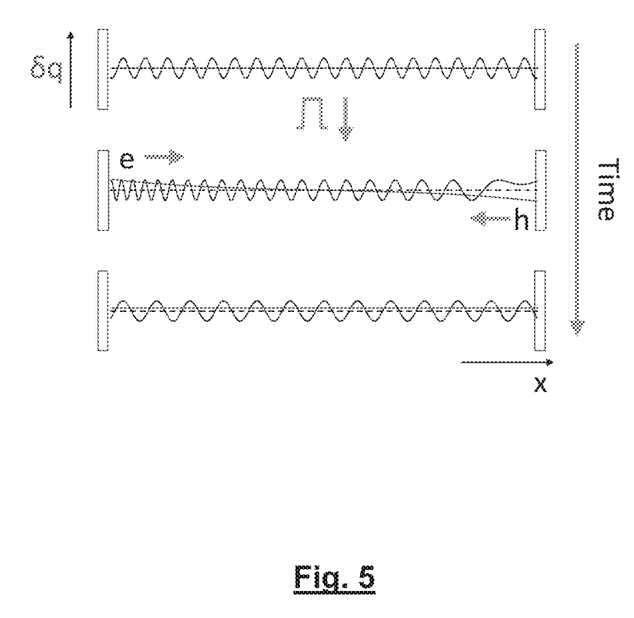
FIG. 5 shows a schematic illustration of the spatial variation of the q-vector between the contacts at different times. Electrons and holes are injected at the electrodes in the C state. They then move through the crystal at different rates, and trapping of one type of carrier leads to a state with a different q.

In the present work, we may consider the application of a transient electric field, which leads to charge injection of electrons and holes at the two contacts respectively. The wave vector of an incommensurate CDW is related to the excess charge density by $q \sim n_c \pi$, where $n_c = ne - nh$ is the charge imbalance between electrons and holes. In a simple picture which emerges, charge injection at each end modifies the local wave vector near the contacts as shown schematically in FIG. 5. The disturbances then propagate along the sample, and eventually, the injected e and h recombine. If the mobilities of the two types of charge carrier are not equal, for example if one type of carrier is more likely to be trapped, then after equilibration we end up with a steady state in which $n_c \neq 0$, leading to an additional conductivity channel, whose resistance is determined by the density of carriers via $n_c \sim q/\pi$, their effective mass and their scattering rate $T_c$.

The extremely sharp thresholds are surprising, suggesting that the velocity at which the electronic order propagates is fast, which is a clear suggestion that collective processes are responsible for W switching. One difference between the optical and electrical switching appears to be that in optical switching so far, only one H state is reached, while multiple states appear to be reachable with electrical pulse injection, some of which are more stable than others.

Discussion of the E (Erase) Process

Although the underlying assumption is that the E process is thermal, we observe that it shows a very sharp threshold in the length of the pulse (FIG. 4). This suggests that once sufficient energy is supplied a collective electronic ordering transition takes place, rather than uncorrelated spatially inhomogeneous microscopic changes of resistance.

R-RAM Device Potential

The very fast non-thermal switching (at present limited in this work by the RC constant of the circuit and external electronics used), sharp threshold behavior in both W and E and simple device construction and 2-contact operation is suitable for ultrafast R-RAM (resistive random access memory) devices. The switching speed demonstrated here of about 5 ns is limited by the device capacitance, not the intrinsic mechanism, yet it is already comparable to state of the art PCM devices [Wong (2010)]. No effort has yet been spent to optimize the thermal characteristics of the device in order to increase the E speed. However, functional devices based on chalcogenide glass phase change show that thermally induced resistivity switching is possible with pulses as short as a few nanoseconds.

Structure of Various Preferred Embodiments

Figure 6:
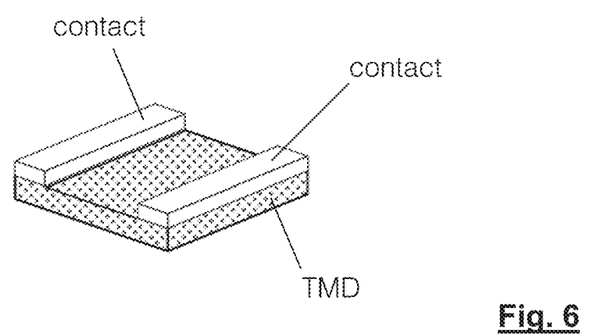
FIGS. 6-11 show various different configurations for preferred embodiments of devices according to the present invention.

FIG. 6 shows a two lateral contact device where the two contacts placed over, or at the sides (not shown in this drawing) of a TMD (transition metal dichalcogenide) crystal are used for W, E and R.

Figure 7:
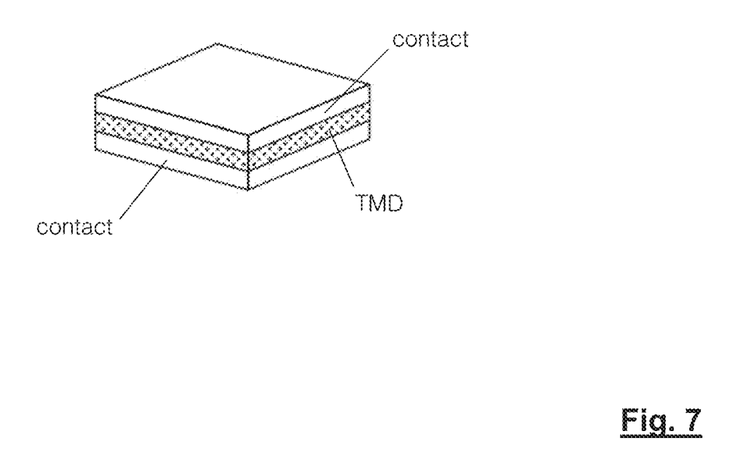

FIG. 7 shows a sandwich configuration with TMD between top and bottom contacts. The same two contacts are used for W, E and R.

Figure 8:
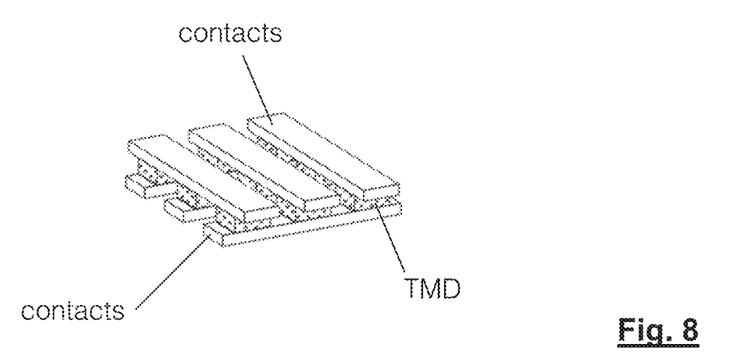

FIG. 8 shows a cross-bar configuration, which is a multiple sandwich configuration with vertical contacts. The functionality of each sandwich is the same as for FIG. 7 described above.

Figure 9:
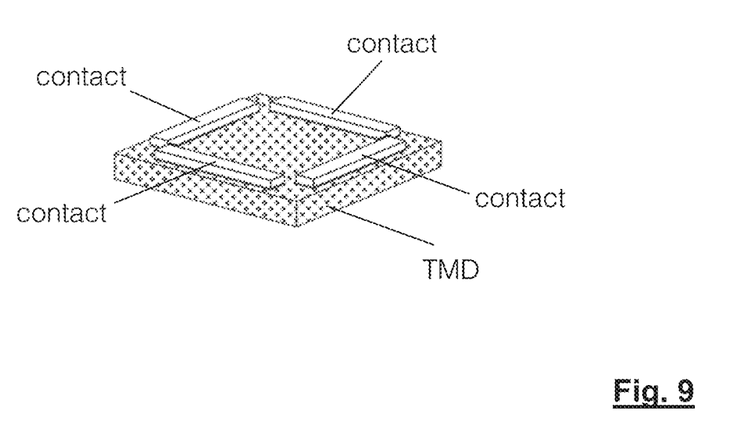

FIG. 9 shows a cross-configuration where two lateral contacts are used for W, and two for E. Any combination of contacts can be used for R.

Figure 10:
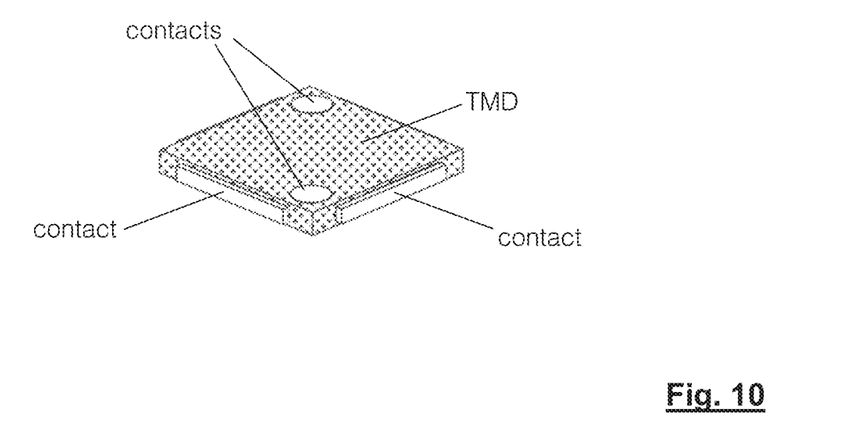

FIG. 10 shows a multiple contact configuration on a TMD crystal where W, E and R each use different contacts.

Any of the embodiments illustrated can be modified to include a heater element in physical contact or proximity with the active material. The heater can be electrically isolated or in contact with any of the contacts, or part of one of the contacts.

Figure 11:
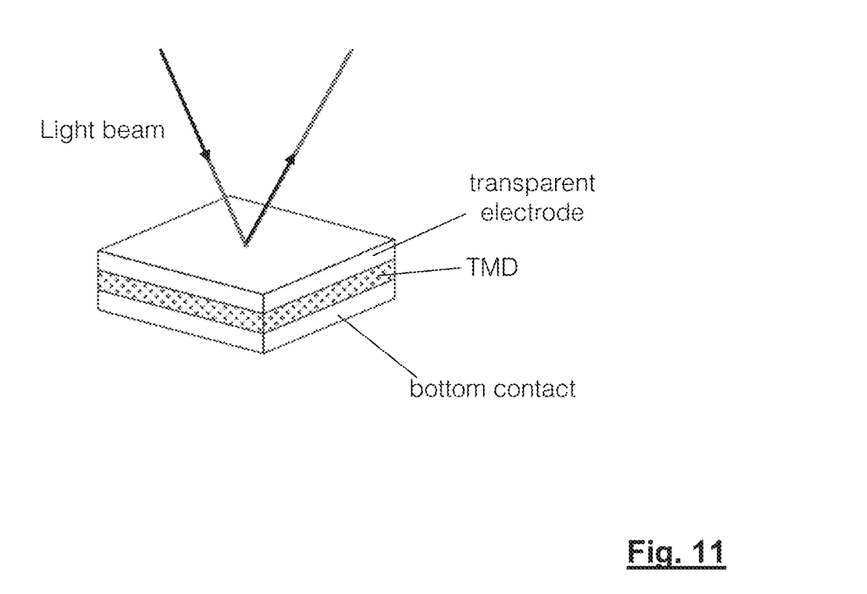

FIG. 11 shows an optical device embodiment in which light is modulated by the change of dielectric constant resulting from electrical switching of the device using any type of contact geometry. In FIG. 11, a transparent top electrode is provided, so that current injection can be carried out for W.

As will be understood, features of the illustrated and described embodiments can be combined with each other.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above are hereby incorporated by reference.

LIST OF NON-PATENT DOCUMENT REFERENCES

Sipos, B., Berger, H., Forro, L., Tutis, E. & Kusmartseva, A. F. From Mott state to superconductivity in 1T-TaS2. *Nature Materials* 7, 960-965 (2008).

Wilson, J., DISALVO, F. & Mahajan, S. Charge-Density Waves and Superlattices in Metallic Layered Transition-Metal Dichalcogenides. *Adv Phys* 24, 117-201 (1975).

Rossnagel, K. On the origin of charge-density waves in select layered transition metal dichalcogenides. *J Phys-Condens Mat* 23, 213001 (2011).

Latyshev, Y. I., Laborde, O., Monceau, P. & Klaumünzer, S. Aharonov-Bohm Effect on Charge Density Wave (CDW) Moving through Columnar Defects in NbSe3. *Phys Rev Lett* 78, 919 (1997).

Zybtsev, S. G., Pokrovskii, V. Y. & Zaitsev-Zotov, S. V. 'Quantized' states of the charge-density wave in microcrystals of K0. 3MoO3. *Nat Comms* 1, 85 (2010).

McMillan, W. Theory of discommensurations and the commensurate/incommensurate charge-density-wave phase transition. *Phys Rev B* 14, 1496-1502 (1976).

TOSATTI, E. & FAZEKAS, P. ON THE NATURE OF THE LOW-TEMPERATURE PHASE OF 1T-TaS2. *J. Phys. Colloques* 37, C4-165-C4-168 (1976).

FAZEKAS, P. & TOSATTI, E. Charge Carrier Localization in Pure and Doped 1T-TaS2. *Physica B & C* 99, 183-187 (1980).

FAZEKAS, P. & TOSATTI, E. Electrical, structural and magnetic properties of pure and doped 1T-TaS2. *Phil. Mag. Part B* 39, 229-244 (1979).

Stojchevska, L., Vaskivskyi, I., Mertelj, T., Kusar, P. & Svetin, D. Ultrafast Switching to a Stable Hidden Quantum State in an Electronic Crystal. *Science* 344, 177 (2014).

Uchida, S., Tanabe, K. & Tanaka, S. Nonlinear conduction in two-dimensional CDW system: 1T-TaS2. *Solid State Communications* 27, 637-640 (1978).

Zettl, A. & GRUNER, G. Onset of charge-density-wave conduction: Switching and hysteresis in NbSe3. *Phys. Rev. B* 5, 700 (1982).

Monceau, P. Electronic crystals: an experimental overview. *Adv Phys* 61, 325-581 (2012).

Sawa, A. Resistive switching in transition metal oxides. *Materials Today* 11, 28-36 (2008).

Waser, R. & Aono, M. Nanoionics-based resistive switching memories. *Nature Materials* (2007).

Vaju, C. et al. Electric-Pulse-driven Electronic Phase Separation, Insulator-Metal Transition, and Possible Superconductivity in a Mott Insulator. 20, 2760-2765 (2008).

Cario, L., Vaju, C., Corraze, B., Guiot, V. & Janod, E. Electric-field-induced resistive switching in a family of mott insulators: Towards a new class of RRAM memories. *Adv Mater* 22, 5193-5197 (2010).

Welnic, W. Unravelling the interplay of local structure and physical properties in phase-change materials. *Nature Materials* 5, 56-62 (2005).

Wong, H. S. P. et al. Phase Change Memory. *Proceedings of the IEEE* 98, 2201-2227 (2010).

Spijkerman, A., de Boer, J., Meetsma, A. & Wiegers, G. X-ray crystal-structure refinement of the nearly commensurate phase of 1T-TaS_{2} in (3+2)-dimensional superspace. *Phys Rev B* (1997).

Yamamoto, A. Hexagonal domain like structure in 1T-TaS_{2}. *Phys. Rev. B* 27, 7823-7826 (1983).

Nakanishi, K. & Shiba, H. Theory of Three-Dimensional Orderings of Charge-Density Waves in 1T-TaX2 (X: S, Se). *J. Phys. Soc. Jpn.* 53, 1103-1113 (1984).

Ishiguro, T. & Sato, H. Electron microscopy of phase transformations in 1T-TaS_ {2}. *Phys Rev B* 44, 2046 (1991).

Requardt, H. et al. Direct Observation of Charge Density Wave Current Conversion by Spatially Resolved Synchrotron X-Ray Studies in NbSe {sub 3}. *Phys Rev Lett* 80, 5631-5634 (1998).

The invention claimed is:

1. A method for operating an electronic device comprising:
   providing the device comprising;
   a first electrode;
   a second electrode; and
   an active material, the active material having selectable and stable first and second macroscopic quantum states having respectively first and second values of electrical resistivity $\rho_1$ and $\rho_2$ at the same temperature, wherein $\rho_1$ is at least 2 times $\rho_2$;
   injecting current into the active material via the electrodes; and
   switching the quantum state of the active material between the first and second macroscopic quantum states.

2. The method according to claim 1 wherein the device is a memory element, the first and second macroscopic quantum states of the active material representing different memory states for the memory element.

3. The method according to claim 2 wherein the device is incorporated in a memory cell, the memory cell including resistance determining means for determining the resistance of the active material.

4. The method according to claim 3 wherein heating of the active material is used in an erase step.

5. The method according to claim 1 wherein the first and second macroscopic quantum states have different charge density wave order.

6. The method according to claim 1 wherein, when $\rho_1$ is expressed as X times $\rho_2$, X is at least 100.

7. The method according to claim 1 wherein the active material is formed from a layered dichalcogenide material.

8. The method according to claim 1 wherein the active material comprises $1T\text{-}TaS_2$ and $1T\text{-}TaS_x Se_{2-x}$.

9. The method according to claim 1 wherein the current injection is achieved at transistor logic level voltage.

* * * * *